United States Patent [19]

Weinberg et al.

[11] Patent Number: 4,688,314

[45] Date of Patent: Aug. 25, 1987

[54] METHOD OF MAKING A PLANAR MOS DEVICE IN POLYSILICON

[75] Inventors: Matthew Weinberg, Mountain View; Mammen Thomas, San Jose, both of Calif.

[73] Assignee: Advanced Micro Devices, Inc., Sunnyvale, Calif.

[21] Appl. No.: 782,842

[22] Filed: Oct. 2, 1985

[51] Int. Cl.$^4$ .................. H01L 21/76; H01L 21/225
[52] U.S. Cl. ........................ 437/56; 437/63; 437/162
[58] Field of Search .............. 29/576 C, 578, 576 T, 29/576 W, 580; 148/174, 187; 156/653, 657; 357/42, 59, 23

[56] References Cited

U.S. PATENT DOCUMENTS

| | | | |
|---|---|---|---|
| 4,259,680 | 3/1981 | Lepselter et al. | 357/35 |
| 4,319,954 | 3/1982 | White et al. | 156/628 |
| 4,445,268 | 5/1984 | Hirao | 29/571 |
| 4,497,683 | 2/1985 | Celler et al. | 156/603 |
| 4,542,580 | 9/1985 | Delivorias | 29/590 |

FOREIGN PATENT DOCUMENTS 2148593  9/1984  United Kingdom .................. 21/76

*Primary Examiner*—Brian E. Hearn
*Assistant Examiner*—William Bunch
*Attorney, Agent, or Firm*—Patrick T. King; John P. Taylor

[57] ABSTRACT

A highly planarized integrated circuit structure having at least one MOS device is described as well as a method of making the structure. The structure comprises a substrate having a field oxide grown thereon with at least one portion defined therein for formation of a source/gate/drain region for an MOS device. All of the contacts of the device are formed using polysilicon which fills the defined portions in the field oxide resulting in the highly planarized structure.

17 Claims, 14 Drawing Figures

METHOD OF MAKING A PLANAR MOS DEVICE IN POLYSILICON

BACKGROUND OF THE INVENTION

1. Field of the Invention

This invention relates to integrated circuit structures. More particularly, this invention relates to a highly planarized integrated circuit structure containing one or more MOS devices and a method of constructing the structure.

2. Description of the Prior Art

The use of MOS devices, in preference to bipolar devices, usually occurs when either the low power consumption or high density characteristics of MOS devices are needed or desired. However, an MOS device is usually constructed in a non planarized fashion with steps created when making contact with the source and drain regions which are lower than the gate region. Furthermore, despite the high density of the MOS devices,, the gate contact usually occupies a large area due to the need to make the contact in a position offset to the gate region because of alignment problems.

Furthermore, in the construction of MOS devices, the source and drain junctions may be formed too deep causing the junctions to sometimes extend under the gate region causing overlap capacitance which degrades the performance of the device. The extension of the junction under the gate may be caused by forming the junction too deeply in the substrate. This can also cause the depletion region to extend sideways into the channel causing a short channel effect which further degrades the performance and functionality as well as long term reliability. If the source and drain regions can be formed as shallow junctions, which do not extend laterally, e.g., beneath the gate, the junction capacitance may also be lowered because of the reduction in the junction area.

It would, therefore, be very desirable to be able to construct an integrated circuit structure comprising one or more MOS devices on a substrate in a manner which would address the problems discussed above including the construction of a highly planarized integrated circuit structure incorporating one or more of such devices therein.

SUMMARY OF THE INVENTION

It is, therefore, an object of this invention to provide a highly planarized improved integrated circuit structure containing one or more MOS devices therein.

It is another object of this invention to provide a highly planarized improved integrated circuit structure containing one or more MOS devices therein characterized by low capacitance between the elements of the devices to thereby improve performance.

It is a further object of this invention to provide a highly planarized improved integrated circuit structure containing one or more MOS devices therein having self aligned contacts to reduce misalignment of contacts and reduce the contact area.

It is yet a further object of this invention to provide a method for efficiently constructing such a highly planarized improved integrated circuit structure containing one or more MOS devices therein.

These and other objects of the invention will be apparent from the following description and accompanying drawings.

In accordance with the invention a highly planarized integrated circuit structure having at least one MOS device therein comprises a substrate having a field oxide grown thereon with one or more openings defined therein for formation of a source/gate/drain region for an MOS device. All of the elements of the device are formed using polysilicon which fills the defined openings in the field oxide resulting in the highly planarized structure.

DESCRIPTION OF THE PREFERRED EMBODIMENTS

The invention provides for a highly planarized integrated circuit structure containing one or more MOS devices constructed therein.

Figure 1:
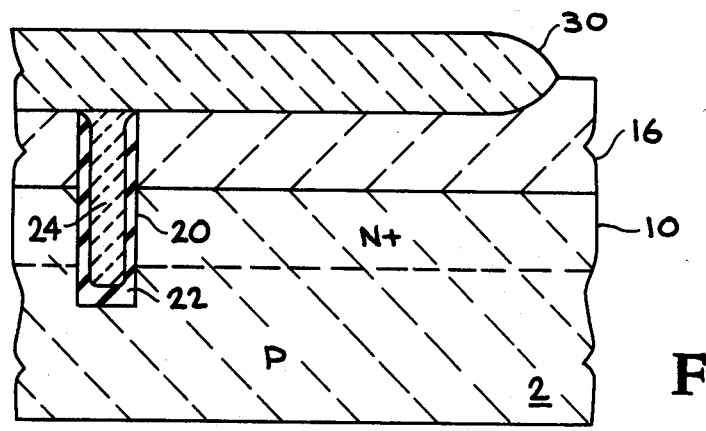
FIG. 1 is a fragmentary vertical cross-sectional view illustrating an early step in the construction of an embodiment of the invention.
Figure 2:
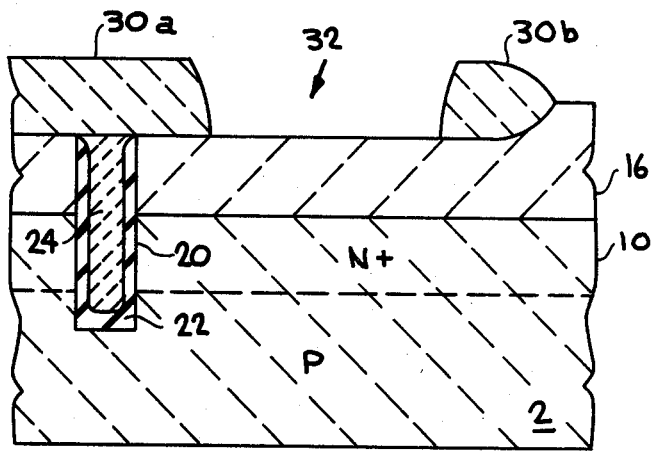
FIGS. 2-9 are fragmentary vertical cross-sectional views of subsequent steps in the construction of the embodiment of FIG. 1.

Referring to FIG. 1, an optional buried N+ layer 10 is shown conventionally formed in a P type silicon substrate 2. While such a buried layer is normally formed to provide the buried collector for a bipolar transistor, the optional provision of a buried layer 10 underneath the MOS device to be formed provides greater alpha particle immunity and latch-up protection to the MOS device. After optional formation of buried layer 10, a layer 16 of epitaxial silicon is grown over layer 10.

As further shown in FIG. 1, an isolation slot 20 may then be cut through epitaxial layer 16 and buried layer 10 and partially into substrate 2 to provide isolation between the MOS device and any other devices which may be formed in the same substrate. A 2000 Angstrom layer of isolation oxide 22 may be grown in slot 20 after which slot 20 may be filled with polysilicon 24. Field oxide 30 is then grown over epitaxial layer 16, including slot 20, in the region where the active devices will be formed.

It should be noted here, that while a slot type of isolation is illustrated, other forms of isolation such as isoplanar or junction isolation may also be used in connection with the practice of this invention.

After growth or deposition of field oxide layer 30, the structure is masked and etched to define, in layer 30, an opening 32 in which will be formed an MOS device leaving the remaining portions 30a and 30b of field oxide layer 30 bounding opening 32. Then a 200-400 Angstrom gate oxide layer 36 is formed over the portion of epi layer 16 exposed in opening 32.

Figure 3:
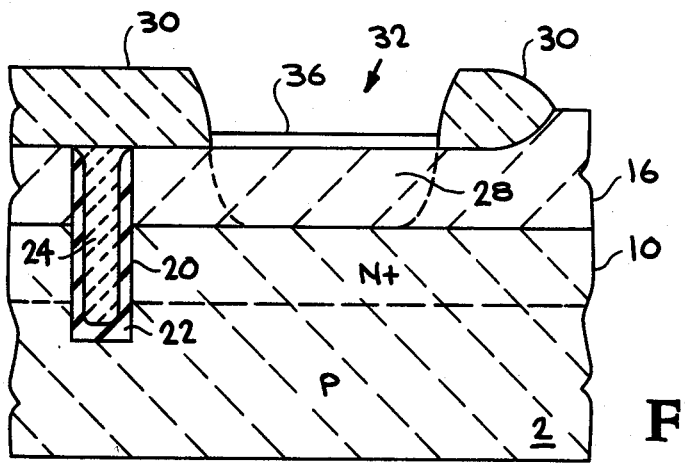

At this stage, a P well 28 may be implanted into epi layer 16 in region 32, as shown in FIG. 3, if an N channel MOS device is to be formed. Alternatively, P well 28 may be implanted immediately after formation of isolation slot 20 and before field oxide layer 30 is grown in which case P well 28 would be completely walled against slot 20.

Figure 4:
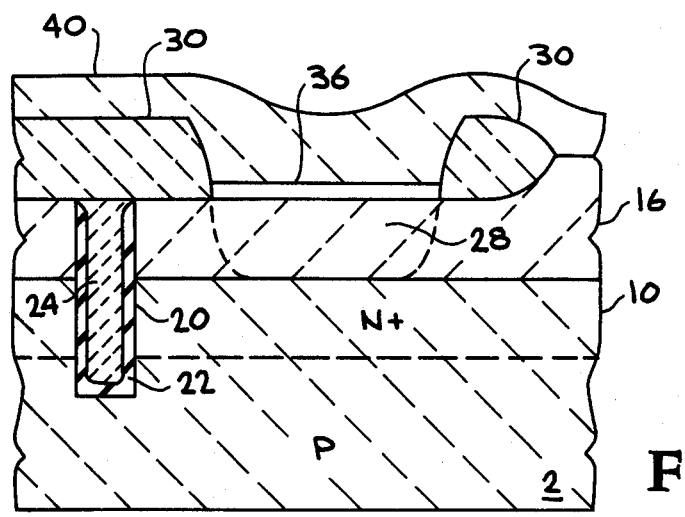
Figure 5:
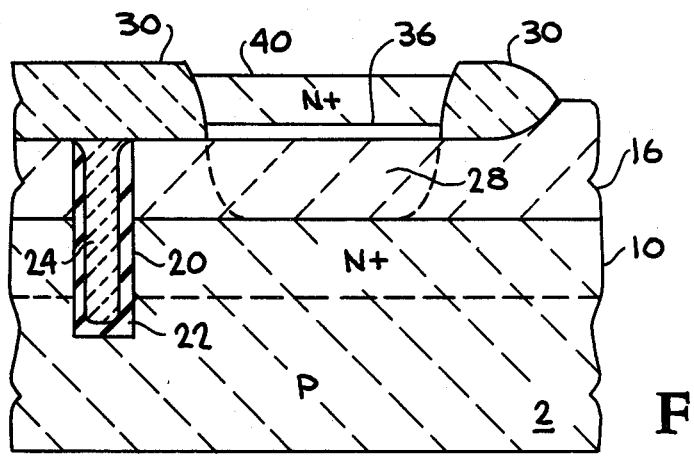

As shown in FIGS. 4 and 5, a layer 40 of polysilicon is now applied, planarized by polishing or etching back to the level of oxide segments 30a and 30b, and then further etched down about 2000 Angstroms below the oxide surface. The polysilicon is then given an N+ implant as shown in FIG. 5.

Figure 6:
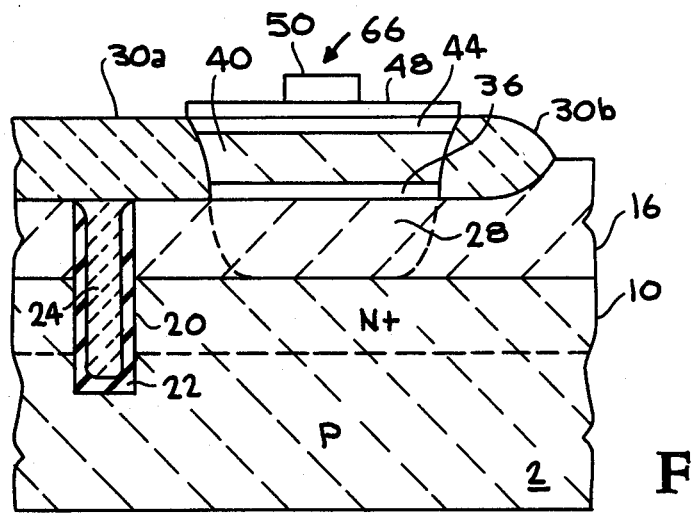

A masking layer of nitride 44 is applied over polysilicon layer 40 and an oxide mask layer 48 is formed over nitride layer 44. It should be noted at this point that the provision of oxide mask portion 48 over nitride mask 44 permits subsequent planarization to be performed since the oxide 48 serves to prevent the underlying nitride mask 44 from being polished away. The oxide/nitride layers are then masked at 50 in FIG. 6 corresponding to a gate region generally indicated at 66. The remainder of the oxide/nitride mask is then removed as well as the underlying polysilicon down to epitaxial layer 16 leaving polysilicon portion 40 which will form the gate contact. The exposed portions of gate oxide layer 36 are also preferably removed at this point.

Figure 7:
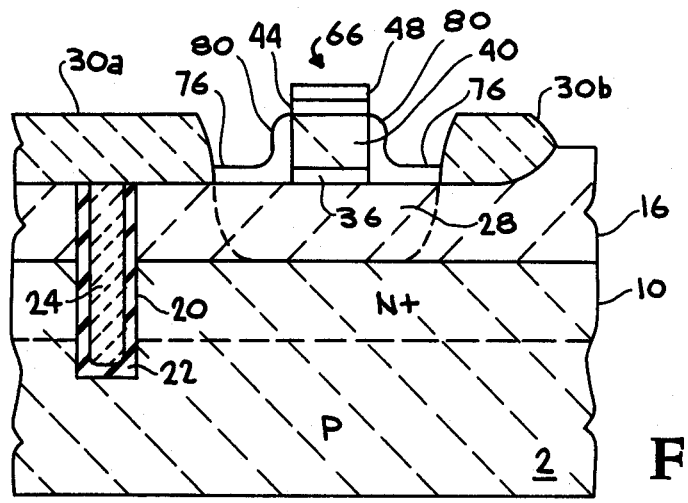

As shown in FIG. 7, thermal oxide may now be grown over the exposed epitaxial silicon and polysilicon by heating the structure to about 900° C. for about 20 to 30 minutes. The oxide grows on the epi layer at 76 at a slower rate than the oxide 80 on the highly doped polysilicon gate contact portion 40. Oxide 76 is allowed to reach a thickness of about 1500 Angstroms which results in a growth of about 4000 Angstroms for the oxide 80 on the sidewalls of polysilicon gate contact portion 40.

Figure 8:
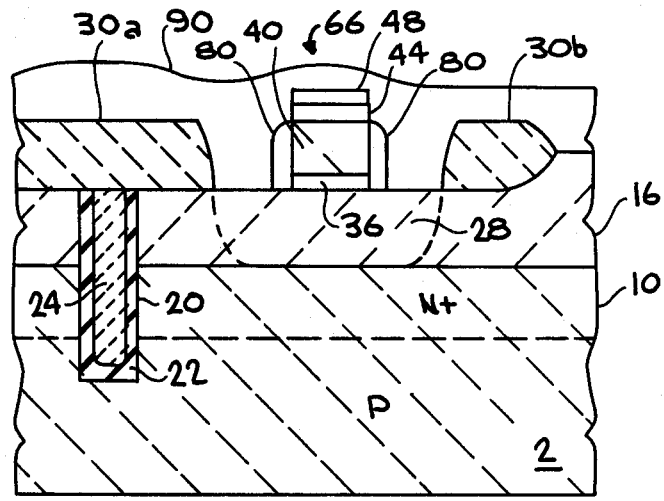

The structure is now exposed to a reactive ion etch (RIE) for a time period sufficient to remove the oxide portions 76 over the epi layer 16 leaving oxide spacers 80 on the polysilicon sidewalls of gate contact portion 40 as seen in FIG. 8.

Alternatively, low pressure chemical vapor deposited glass (LPCVD glass) may be deposited over the exposed epitaxial silicon and polysilicon. The glass is then selectively removed to leave only the oxide spacers 80, again using an RIE to remove the remainder of the glass with the etch time adjusted accordingly.

Figure 9:
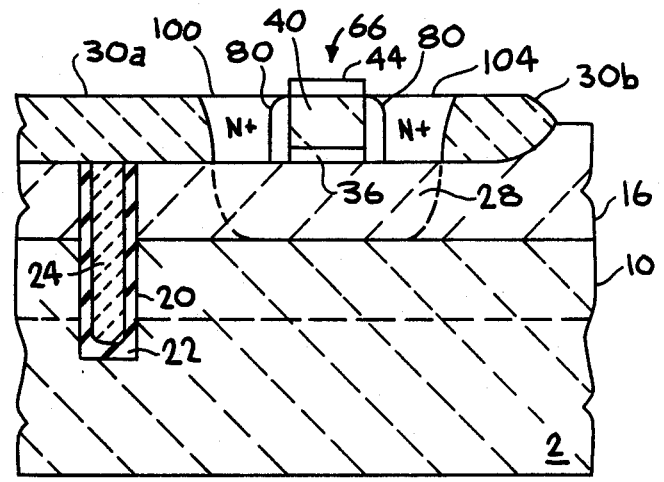

Another layer 90 of polysilicon is now applied over the structure (FIG. 8) and then planaraized, either by etching or mechanical polishing, as shown in FIG. 9. An N+ implantation is carried out in source contact region 100 and drain contact region 104.

Figure 10:
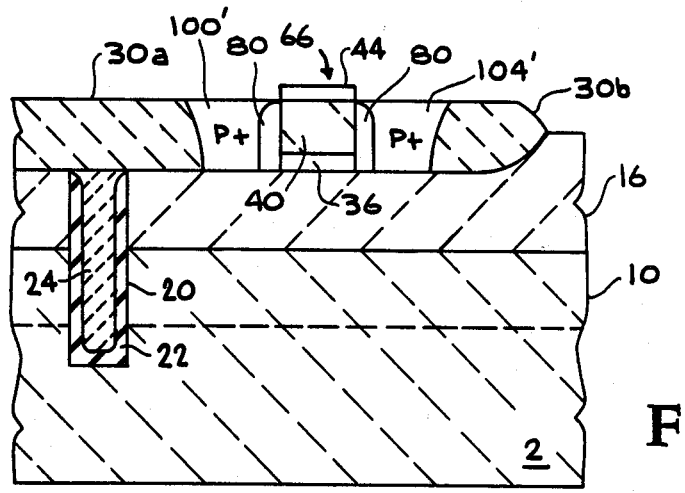
FIG. 10 is a fragmentary vertical cross-sectional view of an alternate procedure to that of FIG. 9 when a P channel device is constructed.

The foregoing step by step procedures, up to FIG. 9, have illustrated the formation of an integrated circuit structure having an N channel (NMOS) device, which, but for the initial formation of the P well, would be the same as that of a PMOS construction. However, the N+ implantation of source contact region 100 and drain contact region 104 shown in FIG. 9 is specific to the construction of an NMOS device. FIG. 10 illustrates an alternate procedure to that of FIG. 9 when a P channel (PMOS) device is formed. In this instance, the source and drain contact regions 100' and 104' are formed by a P+ implantation. When CMOS structures are to be constructed, i.e., when both PMOS and NMOS devices will be formed in the same substrate, the NMOS structure will be masked at this point during the P+ implantation to form the source and drain contact regions of the PMOS device. The PMOS region is then masked during the N+ implantation to form the NMOS source and drain contact regions.

Figure 11:
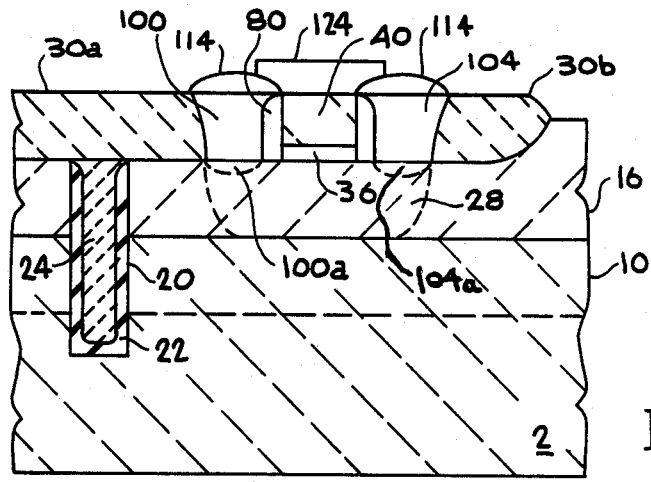
FIGS. 11 and 12 are fragmentary vertical crosssectional views of the final processing steps in the construction of the embodiment of FIG. 1.

After the respective implantations, the structure may be heated to a temperature of 900° C. for 20 to 30 minutes to permit diffusion of the respective implantations into the underlying epi layer 16 to form the source and drain regions 100a and 104a, respectively, in epitaxial layer 16, as shown in FIG. 11, and, at the same time, to grow an oxide layer 114 over source contact 100, and drain contact 104. Alternatively, the structure may be subject to a Rapid Thermal Anneal, e.g., about 6 seconds exposure to high energy, such as high intensity UV, to achieve the desired shallow junctions, followed by a low temperature oxidation, i.e., at a temperature of about 750° to 850° C. It should be noted that, in accordance with the invention, it is only necessary to lightly diffuse the dopants into epi layer 16 as will be seen below.

After the source and drain contact implantations, and the diffusion and oxidation step, nitride mask 44 is removed from the top of the gate contact. An oversized gate mask 124 is then applied over gate contact 66 as shown in FIG. 11. It will be noted that oversized gate mask 124 overlaps a portion of adjoining oxide 114.

Figure 12:
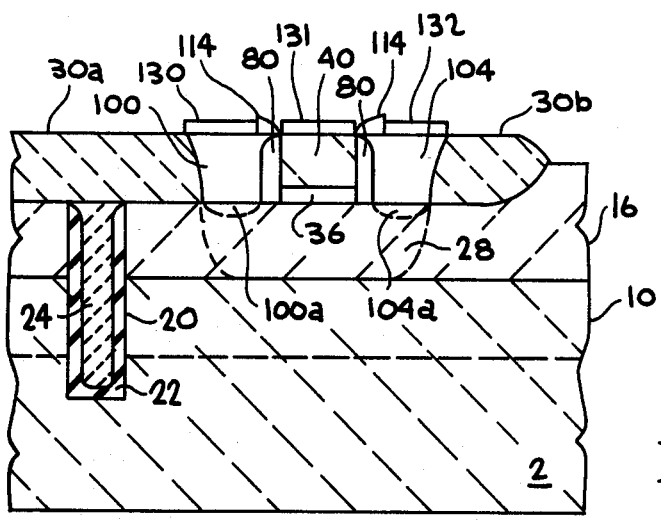

The remaining, exposed portions of oxide 114 are now removed by etching or the like. Mask 124 is then also removed and a metal capable of forming a silicide with the now exposed polysilicon, e.g., titanium or platinum, is applied. The structure is heated to a temperature of about 500° C. for about 15 to 30 minutes to permit the metal to react with the polysilicon to form the corresponding source contact silicide portion 130, gate contact silicide portion 131, and drain contact silicide portion 132 as shown in FIG. 12.

Figure 13:
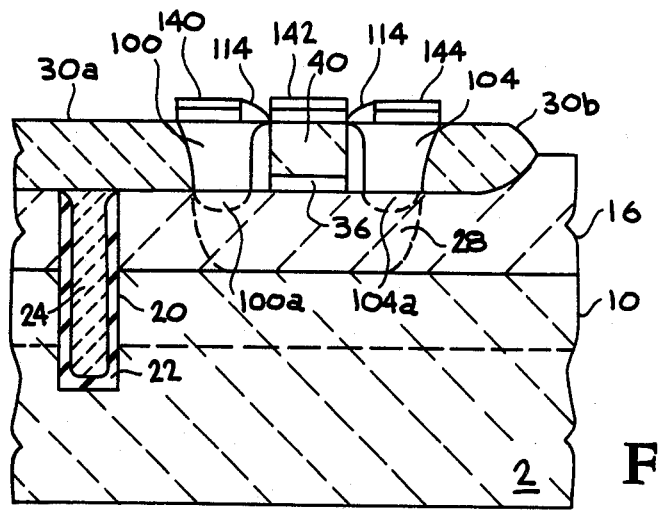
FIG. 13 is a fragmentary vertical cross-sectional view of the completed structure of the invention.
Figure 14:
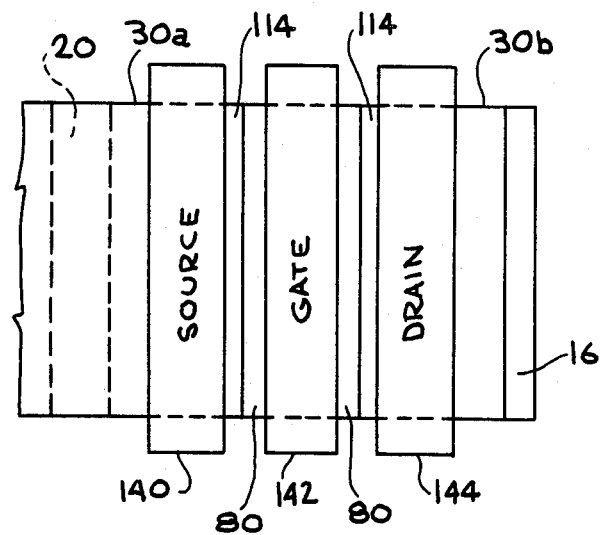
FIG. 14 is a top view of the completed structure of the invention shown in FIG. 13.

The surface is then coated with a conductor such as, for example, a 0.8 micron layer of aluminum over a barrier metal such as TiW. The metal conductor is then masked and selectively etched using conventional techniques to form source contact strip 140, gate contact strip 142, and drain contact strip 144 as shown in FIGS. 13 and 14.

The result is a highly planarized structure containing one or more MOS devices. The provision of the silicide layer over the polysilicon source and drain contacts provides lower sheet resistance. Furthermore the shallow source and drain junctions formed because of the polysilicon contacts reduces short channel effects as well. Since the junction area is low, the junction capacitance of the MOS device will likewise be reduced.

Finally, the use of self-aligned contacts and a highly planarized construction design produces a compact structure with the contacts spaced close together and permits reduction of the contact size resulting in higher density.

Having thus described the invention, what is claimed is:

1. A method of forming a highly planarized integrated circuit structure containing one or more MOS devices which comprises:
   (a) forming a buried layer in at least a portion of a substrate generally parallel to a first surface thereon;
   (b) forming an isolation zone in said substrate generally perpendicular to said first surface and extending into said substrate from said first surface to a point below said buried layer;
   (c) forming an oxide layer on said first surface of said substrate;

(d) removing at least one selective portion of said oxide layer to form an opening therein extending to said first surface of said substrate;

(e) forming an MOS device in said opening by forming a gate oxide over said substrate and then using doped polysilicon deposited over said structure and then planarized to provide doped polysilicon in said opening to a level approximately equal to the top of said oxide layer to thereby form a highly planarized surface on said integrated circuit structure.

2. The method of claim 1 including the further step of selectively removing portions of said doped polysilicon deposited in said opening in said oxide layer to form a gate contact portion.

3. The method of claim 2 wherein said step of selective removal of said polysilicon to form a gate contact portion results in the formation of a raised portion of polysilicon on said substrate surface.

4. The method of claim 3 including the further step of forming oxide spacer members on the sidewalls of said raised polysilicon gate contact portion.

5. The method of claim 4 wherein said step of forming said oxide spacers on the sidewalls of said polysilicon gate contact portion comprises filling with oxide the openings left by said selective removal of polysilicon and then selectively removing a portion of said oxide.

6. The method of claim 5 including the further step of removing said portions of said oxide with a reactive ion etch.

7. The method of claim 6 including the further steps of applying another layer of polysilicon on said structure and then planarizing the structure to thereby fill with polysilicon the openings left by said selective removal of said oxide.

8. The method of claim 7 including the further step of doping said polysilicon used to fill said openings formed by said selective removal of oxide to thereby form source and drain contact portions adjacent said oxide spacers on said raised contact gate portion.

9. The method of claim 8 including the further steps of masking one or more NMOS regions on said integrated circuit structure during P doping of said polysilicon to form one or more PMOS source and drain contact portions and masking one or more PMOS regions of said integrated circuit structure during N doping of said polysilicon to form NMOS source and drain portions.

10. The method of claim 8 including the further steps forming a protective oxide layer on said source and drain contacts and forming source and drain regions in said epitaxial layer beneath the respective contacts.

11. The method of claim 10 wherein said structure is heated to a temperature of about 900° C. for about 20 to 30 minutes to form said protective oxide and to diffuse said source and drain contacts into said epitaxial layer to form said source and drain regions therein.

12. The method of claim 11 wherein said structure is subject to a rapid thermal anneal to form said source and drain regions in said epitaxial layer beneath said respective contacts.

13. The method of claim 12 including the further steps of forming an oversized mask on said gate contact portion, after formation of said source and drain contact portions, which will overlap a portion of said protective oxide over said source and drain contact portions; removing the remaining exposed portions of said protective oxide; removing the oversize mask; and forming a metal silicide in the surface of the now exposed portions of said source, drain, and gate contact portions to provide low resistance lateral current paths in said structure, whereby said structure will be provided with self-aligned contacts.

14. The method of claim 13 including the further step of forming conductive metal contacts on said structure in respective electrical contact with said source, gate, and drain regions in said structure.

15. The method of claim 1 including the further step of forming a gate oxide layer over said substrate before depositing said doped polysilicon in said opening in said field oxide.

16. A method of forming a highly planarized integrated circuit structure containing one or more MOS devices which comprises:

(a) forming a buried layer in at least a portion of a substrate generally parallel to a first surface thereon;

(b) forming an epitaxial layer on said substrate over said buried layer;

(c) forming an isolation zone in said substrate generally extending perpendicularly into said substrate from said first surface to a point below said buried (d) forming an oxide layer on said first surface of said substrate;

(e) removing at least one selective portion of said oxide layer to form an opening therein extending to said first surface of said substrate;

(f) forming a gate oxide over said exposed substrate in said opening; and (g) forming an MOS device in said opening using polysilicon which is deposited in said opening, doped, and planarized to provide doped polysilicon in said opening to a level approximately equal to the top of said oxide layer to thereby form a highly planarized surface on said integrated circuit structure.

17. A method of forming a highly planarized integrated circuit structure containing one or more MOS devices which comprises:

(a) forming an isolation zone in a substrate generally extending perpendicularly into said substate from a first surface thereon;

(b) forming an oxide layer on said first surface of said substrate;

(c) removing at least one selective portion of said oxide layer to form an opening therein extending to said first surface of said substrate;

(d) forming a gate oxide layer over said exposed substrate in said opening;

(e) depositing a first layer of polysilicon over said structure to fill said opening;

(f) doping said first polysilicon layer;

(g) planarizing said layer of doped polysilicon in said opening to a level approximately equal to the top of said oxide layer to thereby form a highly planarized surface on said integrated circuit structure;

(h) forming a mask over said doped polysilicon in said opening to define a polysilicon gate contact portion;

(i) removing the remainder of said first layer of doped polysilicon in said opening leaving a raised polysilicon gate contact portion;

(j) forming a layer of oxide over the exposed substrate and sidewalls of said polysilicon gate contact portion;

(k) selectively removing the oxide over said substrate while leaving oxide on said sidewalls of said polysilicon contact portion;
(l) forming a second layer of doped polysilicon over said structure;
(m) forming source and drain regions in said substrate by diffusing dopant from said second polysilicon layer into said substrate; and
(m) planarizing said second polysilicon layer to form polysilicon source and drain contacts for said MOS device.

* * * * *